(12) United States Patent
Sano

(10) Patent No.: US 12,396,102 B2
(45) Date of Patent: Aug. 19, 2025

(54) ELECTRONIC DEVICE

(71) Applicant: Magnolia White Corporation, Tokyo (JP)

(72) Inventor: Takumi Sano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 124 days.

(21) Appl. No.: 18/078,181

(22) Filed: Dec. 9, 2022

(65) Prior Publication Data

US 2023/0105043 A1    Apr. 6, 2023

(30) Foreign Application Priority Data

Dec. 15, 2021    (JP) .................................. 2021-203279

(51) Int. Cl.
*H05K 1/18*    (2006.01)
(52) U.S. Cl.
CPC ........................ *H05K 1/189* (2013.01); *H05K 2201/10151* (2013.01); *H05K 2201/10174* (2013.01)
(58) Field of Classification Search
CPC ......... H05K 1/189; H05K 2201/10151; H05K 2201/10174; G06F 1/1684; G06F 3/0412; G01N 21/6428; H04N 23/57
USPC ....................................................... 345/175
See application file for complete search history.

(56) References Cited

U.S. PATENT DOCUMENTS

| | | | |
|---|---|---|---|
| 8,207,908 B2 * | 6/2012 | Yamazaki | G02F 1/13452 345/1.3 |
| 10,129,977 B2 * | 11/2018 | Nakabayashi | H05K 1/111 |
| 11,528,802 B2 * | 12/2022 | Rautio | H05K 1/0281 |
| 2015/0193066 A1 * | 7/2015 | Su | G06F 3/0412 345/173 |
| 2015/0282294 A1 | 10/2015 | Wakuda et al. | |
| 2015/0282296 A1 | 10/2015 | Ogura et al. | |
| 2017/0181276 A1 | 6/2017 | Sawada et al. | |
| 2018/0070829 A1 | 3/2018 | Iwawaki et al. | |
| 2018/0172591 A1 * | 6/2018 | Jun | G01N 21/6428 |
| 2019/0068846 A1 * | 2/2019 | Jung | H04N 23/57 |
| 2019/0069407 A1 * | 2/2019 | Chou | B33Y 80/00 |
| 2021/0296423 A1 * | 9/2021 | Jung | H10K 59/131 |
| 2021/0397803 A1 * | 12/2021 | Ryu | G06F 1/1684 |
| 2022/0175057 A1 | 6/2022 | Abe et al. | |

FOREIGN PATENT DOCUMENTS

JP    2017-113088 A    6/2017

OTHER PUBLICATIONS

Office Action issued in Japanese Application No. 2021-203279, dated Apr. 8, 2025, with machine translation.

* cited by examiner

*Primary Examiner* — Prabodh M Dharia
(74) *Attorney, Agent, or Firm* — Michael Best & Friedrich LLP

(57) ABSTRACT

According to one embodiment, an electronic device includes a flexible film-like insulating base and a sensor disposed on the insulating base, and the insulating base includes a detection area in which the sensor is disposed and a peripheral area on an outer side of the detection area, and the peripheral area includes a reinforcement member provided thereon to extend along an outer circumference of the insulating base.

14 Claims, 9 Drawing Sheets

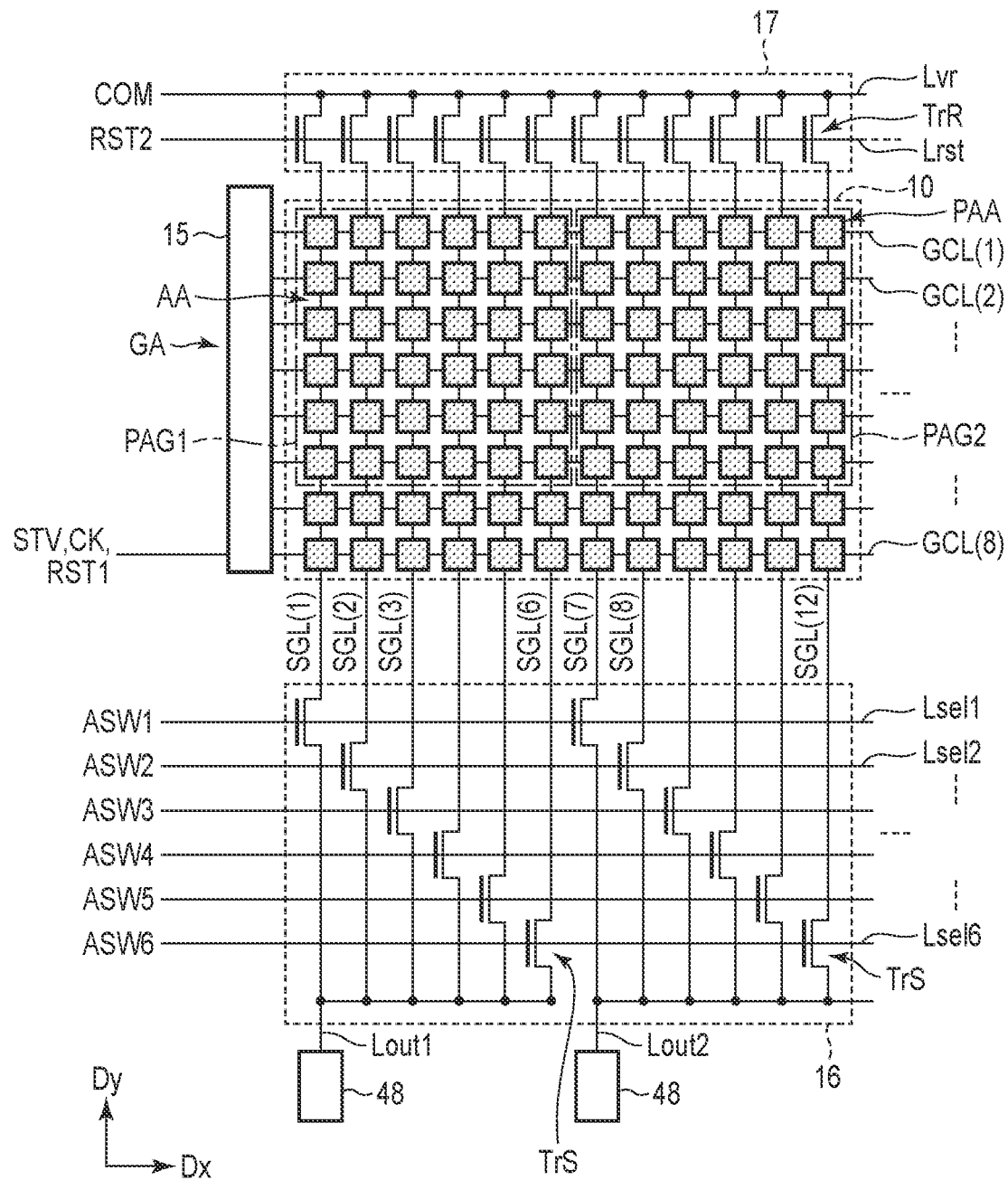
F I G. 3

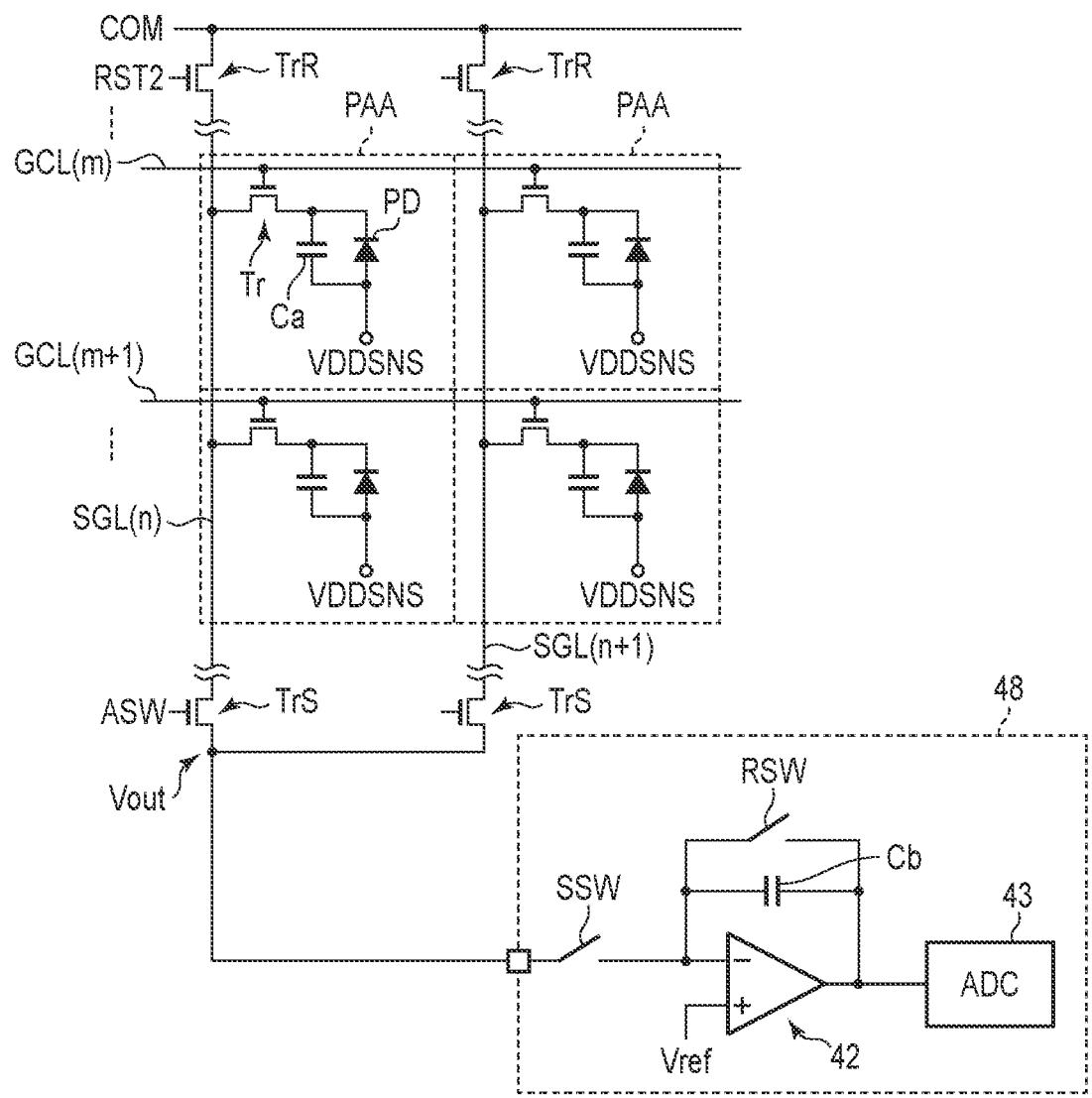
F I G. 4

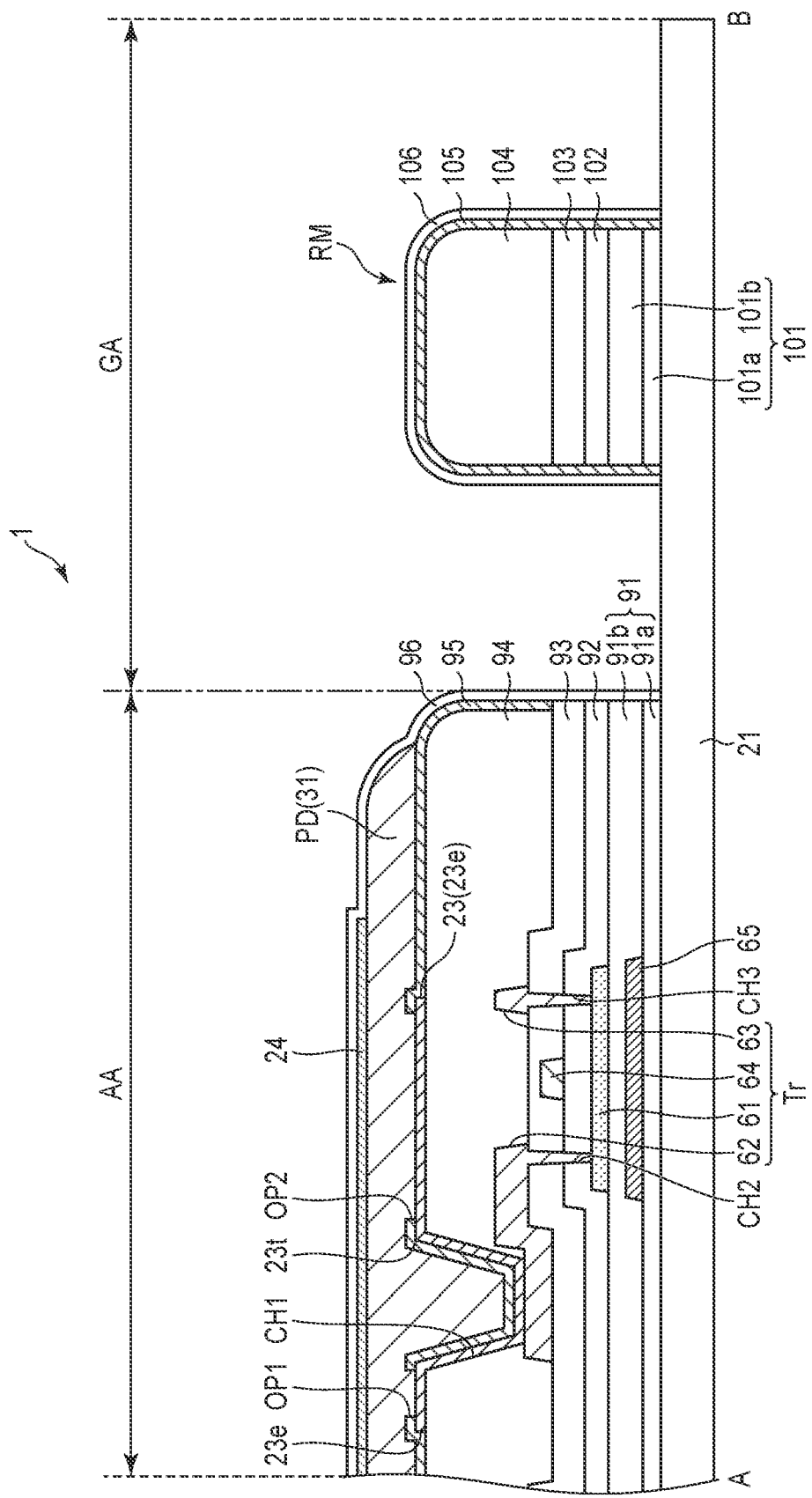
F I G. 6

ELECTRONIC DEVICE

CROSS-REFERENCE TO RELATED APPLICATIONS

This application is based upon and claims the benefit of priority from Japanese Patent Application No. 2021-203279, filed Dec. 15, 2021, the entire contents of which are incorporated herein by reference.

FIELD

Embodiments described herein relate generally to an electronic device.

BACKGROUND

In recent years, the use of flexible substrates in the form of flexible films has been studied in various fields. To cite one example, a film-type flexible substrate on which various sensors such as pressure sensors, temperature sensors and photodiodes are mounted can be attached onto curved surfaces such as housings of electronic devices or the human body.

In such film-type flexible substrates, it is necessary to take measures to prevent the sensors from being damaged by stress caused by excessive bending.

BRIEF DESCRIPTION OF THE DRAWINGS

FIG. 3 is a circuit diagram of the detection device of the embodiment.

FIG. 4 is a circuit diagram showing a plurality of partial detection areas in the embodiment.

FIG. 6 is a cross-sectional view showing the detection device taken along line A-B shown in FIG. 5.

DETAILED DESCRIPTION

Figure 1:
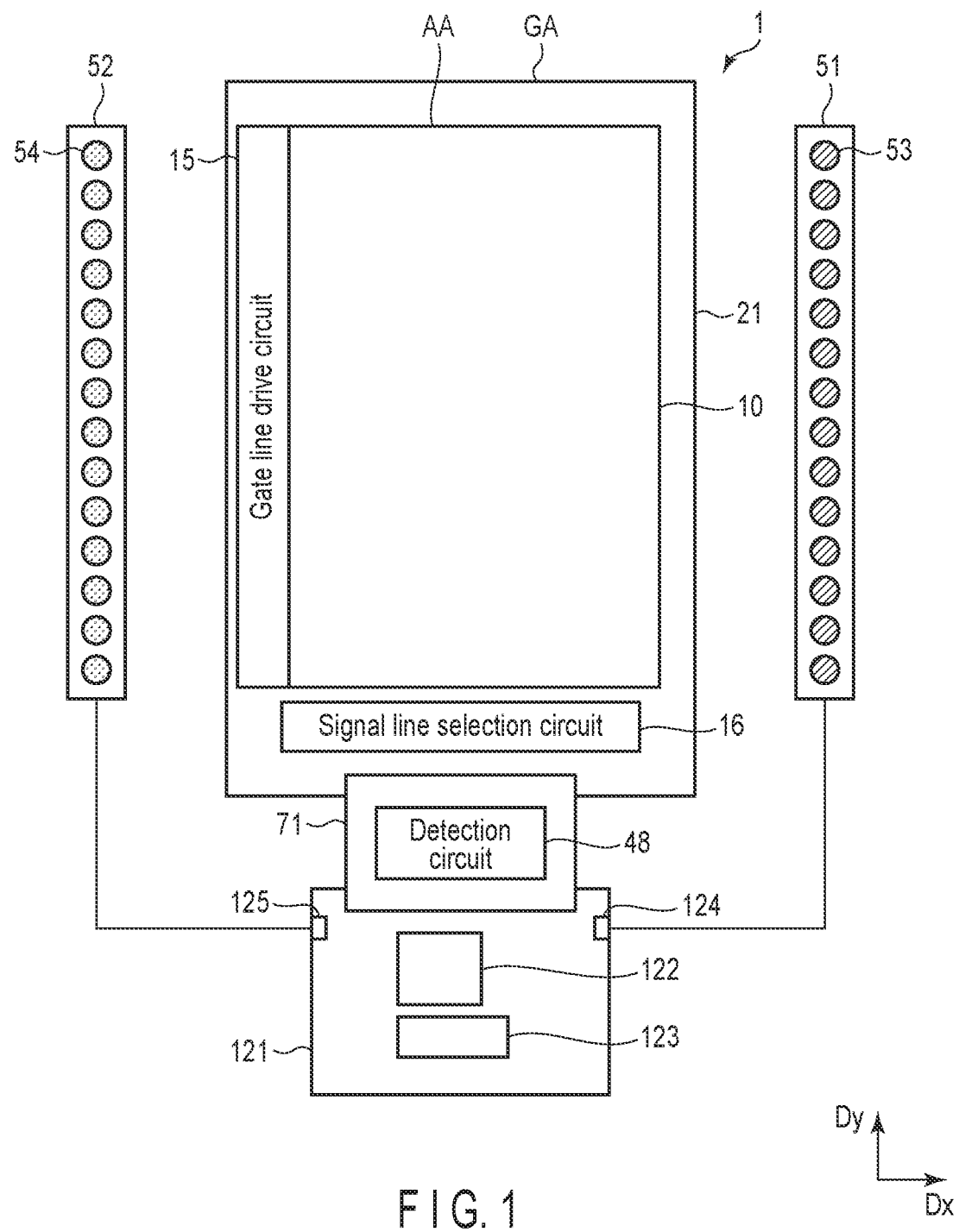
FIG. 1 is a plan view showing a detection device according to one embodiment.

In general, according to one embodiment, an electronic device comprises a flexible film-like insulating base and a sensor disposed on the insulating base. The insulating base includes a detection area in which the sensor is disposed and a peripheral area on an outer side of the detection area, and the peripheral area includes a reinforcement member provided thereon to extend along an outer circumference of the insulating base.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a plan view showing a detection device 1 according to an embodiment. The detection device 1 may be referred to as an electronic device. As shown in FIG. 1, the detection device 1 includes a sensor base 21, a sensor unit 10, a gate line drive circuit 15, a signal line selection circuit 16, a detection circuit 48, a control circuit 122, a power supply circuit 123, a first light source base 51, a second light source base 52, first light sources 53 and second light sources 54. The first light source base 51 comprises a plurality of first light sources 53 provided thereon. The second light source base 52 comprises a plurality of second light sources 54 provided thereon.

To the sensor base 21, a control substrate 121 is electrically connected via a flexible printed circuit board 71. On the flexible printed circuit board 71, the detection circuit 48 is provided. On the control substrate 121, the control circuit 122 and the power supply circuit 123 are provided. The control circuit 122 is, for example, a field programmable gate array (FPGA). The control circuit 122 supplies control signals to the sensor unit 10, the gate line drive circuit 15 and the signal line selection circuit 16 to control the detection operation of the sensor unit 10. Further, the control circuit 122 supplies control signals to the first light sources 53 and the second light sources 54 to control the lighting or non-lighting of the first light sources 53 and the second light sources 54. The power supply circuit 123 supplies voltage signals including a sensor power supply signal VDDSNS (see FIG. 4) and the like to the sensor unit 10, the gate line drive circuit 15 and the signal line selection circuit 16. Meanwhile, the power supply circuit 123 supplies a power supply voltage to the first light sources 53 and the second light sources 54.

The sensor base 21 includes a detection area AA and a peripheral area GA. The detection area AA is an area where a plurality of photodiodes PD (see FIG. 4) of the sensor unit 10 are provided. The peripheral area GA is an area between the outer circumference of the detection area AA and the edge of the sensor base 21, where the photodiodes cannot be provided.

The gate line drive circuit 15 and the signal line selection circuit 16 are provided in the peripheral area GA. More specifically, the gate line drive circuit 15 is provided in an area of the peripheral area GA, which extends along a second direction Dy, whereas the signal line selection circuit 16 is provided in an area of the peripheral area GA which extends along a first direction Dx and between the sensor unit 10 and the detection circuit 48.

In the following descriptions, the first direction Dx is one direction in a plane parallel to the sensor base 21. The second direction Dy is one direction in a plane parallel to the sensor base 21 and orthogonal to the first direction Dx. Note that the second direction Dy may intersect the first direction Dx without being orthogonal thereto. The term "plan view" refers to the positional relationship when viewed from a direction perpendicular to the sensor base 21.

The first light sources 53 are provided on the first light source base 51 so as to be arranged along the second direction Dy. The second light sources 54 are provided on the second light source base 52 so as to be arranged along the second direction Dy. The first light source base 51 and the second light source base 52 are connected to the control circuit 122 and the power supply circuit 123 via terminal portions 124 and 125 provided on the control substrate 121, respectively.

For the first light sources 53 and the second light sources 54, for example, inorganic light-emitting diodes (LED), organic light-emitting diodes (OLED) or the like are adopted. The first light sources 53 and the second light sources 54 emit first light and second light of different wavelengths, respectively.

The first light emitted from the first light sources 53 is reflected by a surface of an object to be detected, such as, mainly a finger, and enters the sensor unit 10. Thus, the sensor unit 10 can detect fingerprints by detecting the shape of irregularities on the surface of the finger or the like. The second light emitted from the second light source 54 is reflected mainly inside the finger or the like or transmitted through the finger or the like and enters the sensor unit 10. Thus, the sensor unit 10 can detect information about the living organism inside the finger or the like. The information about the living organism is, for example, pulse wave, pulse rate, and blood vessel image of the finger or palm. In other words, the detection device 1 may be configured as a fingerprint detection device for detecting fingerprints or a vein detection device for detecting blood vessel patterns such as veins.

The first light has a wavelength of between 500 nm or more and 600 nm or less, for example, about 550 nm, and the second light has a wavelength of 780 nm or more and 950 nm or less, for example, about 850 nm. In this case, the first light is blue or green visible light and the second light is infrared light. The sensor unit 10 can detect a fingerprint based on the first light emitted from the first light sources 53. The second light emitted from the second light sources 54 is reflected inside an object to be detected such as a finger or transmitted through or absorbed by the finger or the like and enters the sensor unit 10. In this manner, the sensor unit 10 can detect pulse waves and vascular images (vascular patterns) as information about the living organism inside the finger or the like.

Alternatively, the first light may have a wavelength of 600 nm or more and 700 nm or less, for example, about 660 nm, and the second light may have a wavelength of 780 nm or more and 900 nm or less, for example, about 850 nm. In this case, based on the first light emitted from the first light sources 53 and the second light emitted from the second light sources 54, the sensor unit 10 can detect blood oxygen saturation in addition to pulse wave, pulse rate and vascular image as information about the living organism. Thus, since the detection device 1 includes the first light sources 53 and the second light sources 54, information on various types of the living organisms can be detected by performing detection based on the first light and detection based on the second light.

Note that the arrangement of the first light sources 53 and the second light sources 54 shown in FIG. 1 is only an example and can be varied as needed. The detection device 1 includes multiple types of light sources (the first light sources 53 and the second light sources 54) as light sources. However, the variety of the types is not limited to this example, but the light sources may be of only one type. For example, the first light source base 51 and the second light source base 52 include a plurality of first light sources 53 and a plurality of second light sources 54, respectively. Further, one or three or more light source bases may be provided, in which the first light sources 53 and the second light sources 54 can be provided. Or, it suffices if at least one or more light sources are provided.

Figure 2:
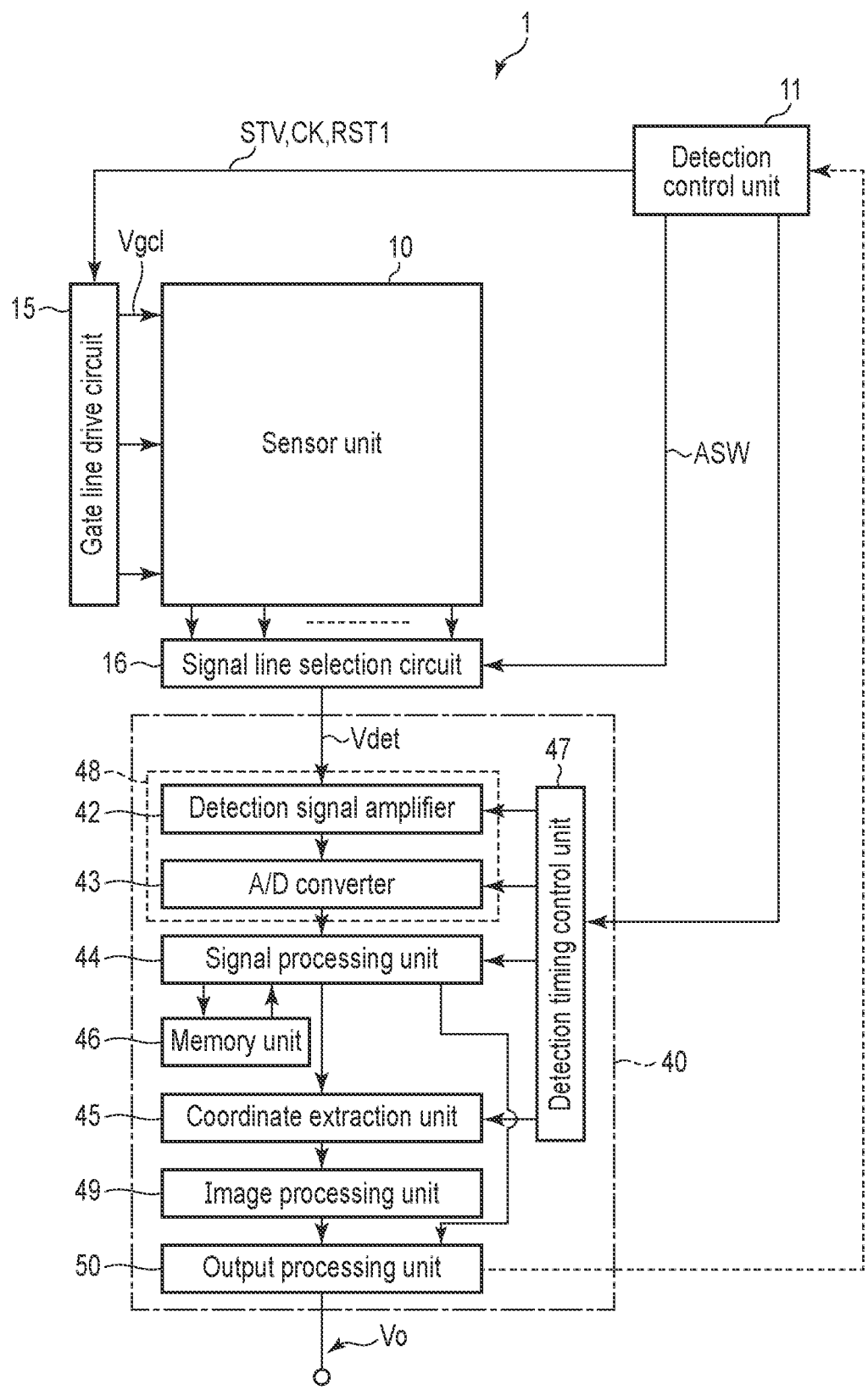
FIG. 2 is a block diagram showing a configuration example of the detection device of the embodiment.

FIG. 2 is a block diagram showing a configuration example of the detection device 1 of the embodiment. As shown in FIG. 2, the detection device 1 further includes a detection control unit 11 and a detection unit 40. Part or all of the functions of the detection control unit 11 are included in the control circuit 122. Further, of the detection unit 40, other than the part or all of the detection circuit 48 are included in the control circuit 122.

The sensor unit 10 includes a plurality of photodiodes PD. Note that in place of the photodiodes PD, the sensor unit 10 may include, for example, a pressure sensor or a temperature sensor. The photodiodes PD of the sensor unit 10 output an electrical signal corresponding to the irradiated light as a detection signal Vdet to the signal line selection circuit 16. Further, the sensor unit 10 carries out detection according to a gate drive signal Vgcl supplied from the gate line drive circuit 15.

The detection control unit 11 is a circuit which supplies control signals to the gate line drive circuit 15, the signal line selection circuit 16 and the detection unit 40, respectively, so as to control their operations. The detection control unit 11 supplies various control signals such as a start signal STV, a clock signal CK, a reset signal RST1 and the like to the gate line drive circuit 15. Further, the detection control unit 11 supplies various control signals including a selection signal ASW to the signal line selection circuit 16. Furthermore, the detection control unit 11 supplies various control signals to the first light sources 53 and the second light sources 54 to control the lighting and non-lighting thereof.

The gate line drive circuit 15 is a circuit which drives a plurality of gate lines GCL (see FIG. 3) based on various control signals. The gate line drive circuit 15 selects multiple gate lines GCL sequentially or simultaneously and supplies the gate drive signal Vgcl to the selected gate lines. Thus, the gate line drive circuit 15 selects a plurality of photodiodes PD connected to the gate lines GCL.

The signal line selection circuit 16 is a switch circuit which selects a plurality of signal lines SGL (see FIG. 3) sequentially or simultaneously. The signal line selection circuit 16 is, for example, a multiplexer. The signal line selection circuit 16 connects the selected signal lines SGL and the detection circuit 48 to each other based on the selection signals ASW supplied by the detection control unit 11. Thus, the signal line selection circuit 16 outputs the detection signals Vdet of the photodiodes PD to the detection unit 40.

The detection unit 40 includes the detection circuit 48, a signal processing unit 44, a coordinate extraction unit 45, a memory unit 46, a detection timing control unit 47, an image processing unit 49 and an output processing unit 50. The detection timing control unit 47 controls the detection circuit 48, the signal processing unit 44, the coordinate extraction unit 45 and the image processing unit 49 to operate in synchronous with each other based on control signals supplied from the detection control unit 11.

The detection circuit 48 is, for example, an analog front-end circuit (AFE) circuit. The detection circuit 48 is a signal processing circuit which has at least the functions of a detection signal amplifier 42 and an A/D converter 43. The detection circuit 48 is a signal processing circuit having at least the functions of a detection signal amplifier 42 and an A/D converter 43. The detection signal amplifier 42 amplifies the detection signal Vdet. The A/D converter 43 converts analog signals output from the detection signal amplifier 42 into digital signals.

The signal processing unit 44 is a logic circuit which detects a predetermined physical quantity input to the sensor unit 10 based on the output signal of the detection circuit 48. When a finger contacts or comes close to the detection surface, the signal processing unit 44 can detect the irregularity on the surface of the finger or palm based on the signal from the detection circuit 48. Further, the signal processing unit 44 can detect information on the living organism based on the signal from the detection circuit 48. The information on the living organism is, for example, a blood vessel image of the finger or palm, pulse wave, pulse rate, blood oxygen concentration and the like.

Further, the signal processing unit 44 may acquire the detection signals Vdet (the information on the living organism) detected at the same time by the multiple photodiodes PD and may execute the process of averaging these signals. In this case, the detection unit 40 can suppress measurement errors caused by noise or relative misalignment between the object to be detected, such as a finger, and the sensor unit 10, thereby enabling stable detection.

The memory unit 46 temporarily stores the signals calculated by the signal processing unit 44. The memory unit 46 may be, for example, a random access memory (RAM), a register circuit or the like.

The coordinate extraction unit 45 is a logic circuit which obtains, when contact or proximity of a finger is detected in the signal processing unit 44, detection coordinates of irregularities on the surface of the finger or the like. Further, the coordinate extraction unit 45 is also a logic circuit that obtains detection coordinates of blood vessels of the finger or palm. The image processing unit 49 combines the detection signals Vdet output from the photodiodes PD of the sensor unit 10 together, to generate two-dimensional information which indicates the shape of the irregularities on the surface of the finger or the like and two-dimensional information which indicates the shape of the blood vessels of the finger or palm. Note that the coordinate extraction unit 45 may output the detection signals Vdet as a sensor output voltage Vo without calculating the detection coordinates. Further, the coordinate extraction unit 45 and the image processing unit 49 may not be contained in the detection unit 40.

The output processing unit 50 functions as a processing unit which carries out processing based on the outputs from multiple photodiodes PD. The output processing unit 50 may include the detected coordinates obtained by the coordinate extraction unit 45 and the two-dimensional information generated by the image processing unit 49 and the like in the sensor output voltage Vo. The function of the output processing unit 50 may be integrated to some other configuration (for example, the image processing unit 49 or the like).

Next, an example of the circuit configuration of the detection device 1 will be described. FIG. 3 is a circuit diagram showing the detection device 1. As shown in FIG. 3, the sensor unit 10 includes a plurality of partial detection areas PAA arranged in a matrix. In each of the partial detection areas PAA, a photodiode PD is provided.

The gate lines GCL each extend along the first direction Dx and each is connected to a plurality of partial detection areas PAA aligned along the first direction Dx. Further, gate lines GCL(1), GCL(2), . . . , GCL(8) are arranged along the second direction Dy and they are each connected to the gate line drive circuit 15. Note that in the following descriptions, when there is no need to distinguish the gate lines GCL(1), GCL(2), . . . , GCL(8) from each other, they are simply represented as gate lines GCL. In FIG. 3, to make the illustration more easily understandable, eight gate lines GCL are shown, but this is only an example. Note that M gate lines (M=8 or more, for example, M=256) may be arranged.

The signal lines SGL each extend along the second direction Dy and each is connected to the photodiodes PD of the partial detection areas PAA aligned along the second direction Dy. Further, signal lines SGL(1), SGL(2), . . . , SGL(12) are arranged along the first direction Dx and are each connected to the signal line selection circuit 16 and the reset circuit 17. In the following descriptions, when there is no need to distinguish the signal lines SGL(1), SGL(2), . . . , SGL(12) from each other, they are simply represented as signal lines SGL.

Further, to make the illustration more easily understandable, twelve signal lines SGL are shown, but this is only an example. Note that N signal lines (N is 12 or more, for example, N=252) may be provided. Further, the resolution of the sensor is set to, for example, 508 dpi (dot per inch) and the number of cells is 252×256. In FIG. 3, the sensor unit 10 is provided between the signal line selection circuit 16 and the reset circuit 17. But the configuration is not limited to this, and the signal line selection circuit 16 and the reset circuit 17 may be connected to the end portions of the signal lines SGL on the same side.

The gate line drive circuit 15 receives various types of control signals such as the start signal STV, clock signal CK, reset signal RST1 and the like from the control circuit 122 (see FIG. 1). Based on the various control signals, the gate line drive circuit 15 selects the gate lines GCL(1), GCL(2), . . . , GCL(8) sequentially in a time-divisional manner. The gate line drive circuit 15 supplies the gate drive signals Vgcl to the selected gate lines GCL. Thus, the gate drive signals Vgcl are supplied to a plurality of first switching elements Tr connected to the gate lines GCL, and the partial detection areas PAA arranged along the first direction Dx are selected as targets to be detected.

The signal line selection circuit 16 includes a plurality of selection signal lines Lsel, a plurality of output signal lines Lout and third switching elements TrS. The third switching elements TrS are each provided for multiple signal lines SGL. Six signal lines SGL(1), SGL(2), . . . , SGL(6) are connected to a common output signal line Lout1. Six signal lines SGL(7), SGL(8), . . . , SGL(12) are connected to a common output signal line Lout2. The output signal lines Lout1 and Lout 2 are connected to the detection circuits 48, respectively.

Here, the signal lines SGL(1), SGL(2), . . . , SGL(6) are grouped as a first signal line block, and signal lines SGL(7), SGL(8), . . . , SGL(12) are grouped as a second signal line block. Multiple selection signal lines Lsel are connected to the gates of the third switching elements TrS included in one signal line block, respectively. Further, one selection signal line Lsel is connected to the gates of the third switching elements TrS of multiple signal line blocks.

The control circuit 122 (see FIG. 1) supplies selection signals ASW sequentially to the selection signal lines Lsel. Thus, the signal line selection circuit 16 selects, by the operation of the third switching elements TrS, sequentially selects signal lines SGL in one signal line block in a time-divisional manner. Further, the signal line selection circuit 16 selects one signal line SGL in each of multiple signal line blocks. With this configuration, it is possible in the detection device 1 to reduce the number of integrated circuits (ICs) including the detection circuits 48 or the number of terminals of the ICs. Note that the signal line selection circuit 16 may connect a bundle of multiple signal lines SGL to the detection circuits 48.

As shown in FIG. 3, the reset circuit 17 includes a reference signal line Lvr, a reset signal line Lrst and fourth switching elements TrR. The fourth switching element TrR is provided for multiple signal lines SGL. The reference signal line Lvr is connected to either the sources or drains of the fourth switching elements TrR. The reset signal line Lrst is connected to the gates of the fourth switching elements TrR.

The control circuit 122 supplies a reset signal RST2 to the reset signal line Lrst. Thus, the multiple fourth switching elements TrR are set to on and the multiple signal lines SGL are electrically connected to the reference signal line Lvr. The power supply circuit 123 supplies a reference signal COM to the reference signal line Lvr. Thus, the reference signal COM is supplied to a capacitive element Ca (see FIG. 4) contained in each of the partial detection areas PAA.

FIG. 4 is a circuit diagram showing a plurality of partial detection areas PAA. Note that FIG. 4 also illustrates the circuit configuration of the detection circuit 48. As shown in FIG. 4, the partial detection areas PAA each include a photodiode PD, a capacitive element Ca, and a first switching element Tr. The capacitive element Ca is a capacitor (sensor capacitor) formed in the photodiode PD and is equivalently connected in parallel to the photodiode PD.

In FIG. 4, of the gate lines GCL, two gate lines GCL(m) and GCL(m+1) which are aligned along the second direction Dy are shown. Further, of the signal lines SGL, two signal lines SGL(n) and SGL(n+1) aligned along the first direction Dx are shown. The partial detection areas PAA are each an area surrounded by the respective gate lines GCL and respective signal lines SGL.

The first switching elements Tr are provided for the respective photodiodes PD. The first switching elements Tr are each constituted by a thin-film transistor. In this example, it an n-channel metal oxide semiconductor (MOS) thin-film transistor (TFT).

The gates of the first switching elements Tr belonging to those of partial detection areas PAA which are aligned along the first direction Dx are connected to the respective gate line GCL. The sources of the first switching elements Tr belonging to those partial detection areas PAA which are aligned along the second direction Dy are connected to the respective signal line GCL. The drain of each first switching element Tr is connected to the cathode of the respective photodiode PD and the respective capacitive element Ca.

To the anode of the photodiode PD, a sensor power supply signal VDDSNS is supplied from the power supply circuit 123. Further, to the signal line SGL and the capacitive element Ca, the reference signal COM, which is the initial potential of the signal line SGL and the capacitive element Ca, is supplied from the power supply circuit 123.

When a partial detection area PAA is irradiated with light, a current corresponding to the amount of the light flows to the respective photodiode PD, and thus a charge is accumulated in the capacitive element Ca. When the first switching element Tr is on, a current flows to the signal line SGL according to the charge accumulated in the capacitive element Ca. The signal line SGL is connected the detection circuit 48 via the third switching element TrS of the signal line selection circuit 16. With this configuration, the detection device 1 can detect the signal corresponding to the amount of the light irradiated onto the photodiodes PD for each partial detection area PAA or each block unit PAG (FIG. 3).

During the readout period while the switch SSW is on, the detection circuit 48 is connected to the respective signal line SSW. The detection signal amplifier 42 of the detection circuit 48 converts the variation of the current supplied from the signal line SGL into a voltage variation, and then amplifies it. To a non-inverting input unit (+) of the detection signal amplifier unit 42, a reference potential (Vref) having a fixed potential is input and an inverting input terminal (−) is connected to the signal line SGL. In this embodiment, the same signal as the reference signal COM is input as the reference potential (Vref) voltage. The signal processing unit 44 (see FIG. 2) calculates the difference between the detection signal Vdet in the case wherein light is irradiated and the detection signal Vdet in the case where no light is irradiated, as the sensor output voltage Vo. Further, the detection signal amplifier 42 includes a capacitive element Cb and a reset switch RSW. In the reset period, the reset switch RSW is on and the charge on the capacitive element Cb is reset.

Figure 5:
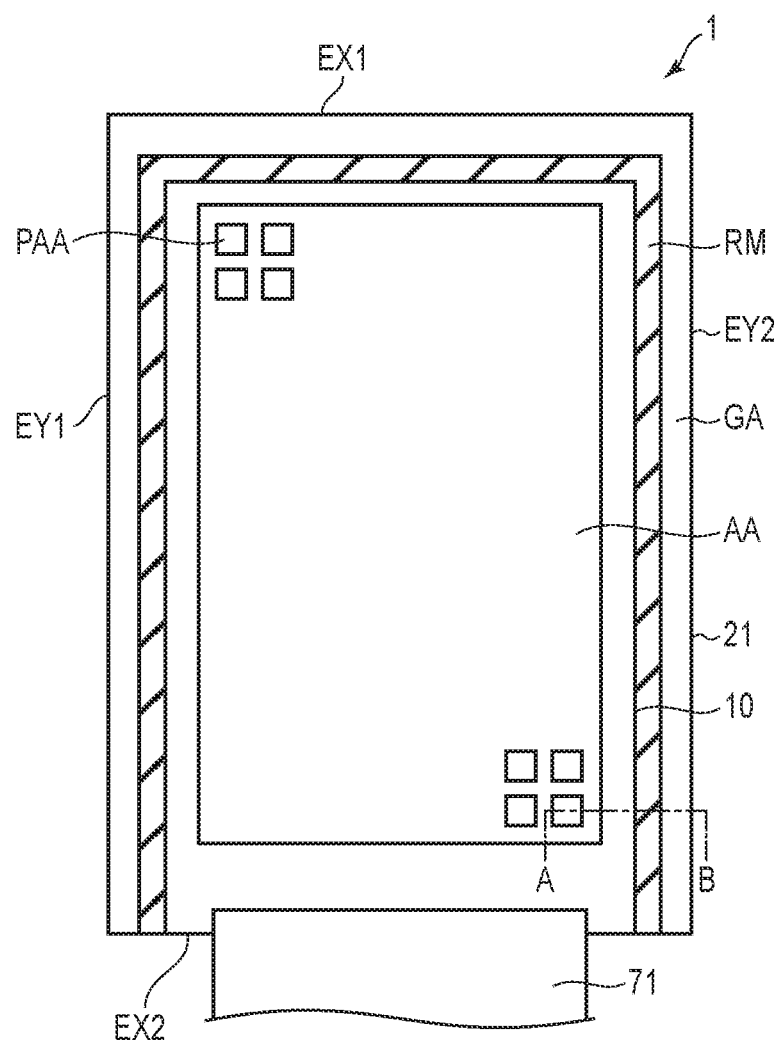
FIG. 5 is another plan view of the detection device of the embodiment.

FIG. 5 is a plan view schematically showing the detection device 1 of this embodiment. In FIG. 5, peripheral circuits located in the peripheral area GA, such as the gate line drive circuit 15, the signal line selection circuit 16 and the like are omitted from illustration, and mainly a reinforcement member RM, which is disposed in the peripheral area GA, is illustrated. As shown in FIG. 5, in the peripheral area GA, the reinforcement member RM is arranged on the sensor base 21 so as to extend along long sides EY1 and EY2 of the sensor base 21 and a short side EX1 of the sensor base 21. In other words, the reinforcement member RM is arranged on the sensor base 21 so as to surround the three sides of the detection area AA. The reinforcement member RM is, for example, a multilayered film of two or more layers of a combination of, for example, inorganic films and organic films. Note that a detailed layer structure of the reinforcement member RM will be described later, and therefore it is omitted here.

The sensor base 21, which constitutes the detection device 1, is formed of a film-like resin, such as of polyimide, for example. For this reason, the sensor base 21 is prone to curling, and when, for example, a single detection device 1 is cut from a large sheet on which a number of detection devices 1 are formed, the sensor base 21 may be curled (bent excessively). If the sensor base 21 is curled, drawbacks such as the inorganic insulating film and the like which constitutes the sensor unit 10 cracking due to stress caused by such curling (excessive bending) may occur. With respect to such drawbacks, in the detection device 1 of this embodiment, the reinforcement member RM is arranged to surround the three sides of the detection area AA. Thus, compared to the configuration in which the reinforcement member RM is not provided, the member can be arranged more densely in the peripheral area GA, thus making it possible to improve the rigidity of the detection device 1. With this configuration, it is possible to suppress the above-described curling tendency and prevent the occurrence of the above-described drawbacks.

Note that FIG. 5 shows an example case where the reinforcement member RM is disposed on the sensor base 21 so as to extend along the long sides of EY1 and EY2 and the short side EX1 thereof in the peripheral area GA, but the configuration is not limited to this. It suffices if the reinforcement member RM is disposed on the sensor base 21 so as to extend along at least the long sides EY1 and EY2 of the sensor base 21 in the peripheral area GA. Even in this case, the rigidity of the detection device 1 can be sufficiently improved compared to a configuration in which the reinforcement member RM is not disposed, and thus the occurrence of the above-described drawbacks can be suppressed.

FIG. 6 is a cross-sectional view of the detection device 1 cut along line A-B shown in FIG. 5. In the following descriptions, a configuration provided on a detection area AA side and a configuration provided on a peripheral area GA side will be described in order. The configuration provided on the detection area AA side will be described first.

As shown in FIG. 6, on the detection area AA side, the detection device 1 includes the sensor base 21, a first switching element Tr, an organic insulating film 94, a lower electrode 23, a first inorganic insulating film 95, a photodiode PD (note that only an active layer 31 is shown in FIG. 6), an upper electrode 24 and a sealing film 96.

The sensor base 21 is an insulating base and, for example, a film-like resin of polyimide or the like is used therefor.

In this specification, in the directions perpendicular to the surface of the sensor base 21, the direction from the sensor base 21 towards the photodiode PD is referred to as "upper side" or simply "above", and the direction from the photodiode PD towards the sensor base 21 is referred to as "lower side" or simply "below".

On the sensor base 21, an undercoat film 91 is provided. The undercoat film 91 has, for example, a two-layer stacked structure including insulating films 91a and 91b. The undercoat film 91 is formed of, for example, an inorganic insulating film such as a silicon nitride film or silicon oxide film. The configuration of the undercoat film 91 is not limited to that shown in FIG. 6. For example, the undercoat film 91 may be of a single layer film or a multilayer structure of three or more layers.

The light-shielding film 65 is provided on the insulating film 91a. The light-shielding film 65 is provided between the semiconductor layer 61 and the sensor substrate 21. The detection device 1 (photodiode PD) of this embodiment is a lower-surface light-receiving type optical sensor, and light reflected from the surface of a detected object such as a finger enters the photodiode PD from the lower surface side of the sensor base 21. Here, the light-shielding film 65 prevents light from entering the channel region of the semiconductor layer 61 from the sensor base 21 side.

The first switching element Tr (transistor) is provided on the sensor base 21. The semiconductor layer 61 is provided on the undercoat film 91. The semiconductor layer 61 is, for example, made of polysilicon. Note that the material of the semiconductor layer 61 is not limited to this and may be a microcrystalline oxide semiconductor, an amorphous oxide semiconductor, low-temperature polysilicon or the like. Further, although only n-type TFT is shown as the first switching element Tr, p-type TFT may as well be formed at the same time.

The gate insulating film 92 is provided on the undercoat film 91 to cover the semiconductor layer 61. The gate insulating film 92 is, for example, an inorganic insulating film such as a silicon oxide film. The gate electrode 64 is provided on the gate insulating film 92. In the example shown in FIG. 6, the first switching element Tr has a top gate structure. Note that the structure is not limited to this, and the first switching element Tr may as well be of a bottom-gate structure, or a dual-gate structure in which gate electrodes 64 are provided respectively on the upper and lower sides of the semiconductor layer 61.

The interlayer insulating film 93 is provided on the gate insulating film 92 to cover the gate electrode 64. The interlayer insulating film 93 has, for example, a multilayered structure in which a silicon nitride film and a silicon oxide film are stack one on another. The source electrode 62 and the drain electrode 63 are provided on the interlayer insulating film 93. The source electrode 62 is connected to the source region of the semiconductor layer 61 via a third contact hole CH2 made in the gate insulating film 92 and the interlayer insulating film 93. The drain electrode 63 is connected to the drain region of the semiconductor layer 61 via a third contact hole CH3 made in the gate insulating film 92 and the interlayer insulating film 93.

The organic insulating film 94 is provided on the interlayer insulating film 93 to cover the source electrode 62 and the drain electrode 63 of the first switching element Tr. The organic insulating film 94 is an organic planarization film and has superior coverage of wiring steps and surface flatness compared to inorganic insulating materials formed by CVD or other methods.

The photodiode PD is provided on the organic insulating film 94. The lower electrode 23 and the first inorganic insulating film 95 are provided between the sensor base 21 and the organic insulating film 94, and the photodiode PD along a direction perpendicular to the surface of the sensor base 21.

In more detail, the lower electrode 23 is provided on the organic insulating film 94 and is connected to the source electrode 62 of the first switching element Tr at an bottom surface of the first contact hole CH1 made in the organic insulating film 94. The lower electrode 23 is a cathode of the photodiode PD and is made of, for example, a light-transmitting conductive material such as indium tin oxide (ITO) or indium zinc oxide (IZO). The lower electrode 23 is disposed for each of the partial detection areas PAA (the photodiode PD) to be apart from each other. The photodiode PD has a larger area than that of the lower electrode 23 in plan view, and covers the upper surface of the lower electrode 23 and an edge 23e on an outer circumferential side.

The first inorganic insulating film 95 is provided on the organic insulating film 94 to cover the lower electrode 23. For the first inorganic insulating film 95, for example, a material such as a silicon nitride film or an aluminum oxide film is used. The first inorganic insulating film 95 covers the upper surface of the lower electrode 23 and includes at least one or more openings (a first opening OP1 and a second opening OP2) in areas overlapping the upper surface of the lower electrode 23. The photodiode PD is electrically connected to the lower electrode 23 via the first opening OP1 and the second opening OP2. The number of openings is not limited to two, namely, the first opening OP1 and the second opening OP2 provided in the first inorganic insulating film 95. It suffices if the first inorganic insulating film 95 includes only one opening, but may include three or more openings.

The first inorganic insulating film 95 has an area larger than that of the lower electrode 23 in plan view, and covers at least the outer circumferential edge 23e of the lower electrode 23. The first inorganic insulating film 95 is provided in the area overlapping the photodiode PD and is provided between the organic insulating film 94 and the photodiode PD in the area not overlapping the lower electrode 23. With this configuration, the first inorganic insulating film 95 also functions as a barrier film to prevent moisture from entering from the organic insulating film 94 to the photodiode PD.

The first inorganic insulating film 95 is formed also inside the first contact hole CH1. The lower electrode 23 and the inorganic insulating film 95 are stacked on an inner side surface and bottom surface of the first contact hole CH1. On the inner side surface of the first contact hole CH1, the organic insulating film 94, the lower electrode 23 and the first inorganic insulating film 95 are stacked in this order. On the bottom surface of the first contact hole CH1, the source electrode 62, the lower electrode 23 and the first inorganic insulating film 95 are stacked in this order. The first inorganic insulating film 95 is provided at a position overlapping the opening edge of the first contact hole CH1, so as to cover a corner portion 23t of the lower electrode 23.

Further, the upper electrode 24 is provided on the photodiode PD. The upper electrode 24 is an anode of the photodiode PD and is continuously formed over multiple partial detection areas PAA (photodiodes PD). The upper electrode 24 is made of, for example, a metal material such as silver (Ag) and functions as a reflective electrode.

The sealing film 96 is provided on the upper electrode 24. The sealing film 96 is formed from an inorganic film such as a silicon nitride film or aluminum oxide film, or a resin film such as of acrylic. The sealing film 96 is not limited to be of a single layer, but may be of a multilayer film in which two or more layers of a combination the above-mentioned inorganic film and resin film. The sealing film 96 seals the photodiode PD well to prevent moisture from entering from the upper surface side.

Next, the configuration on the peripheral area GA side will be described.

As shown in FIG. 6, on the peripheral area GA side, the detection device 1 includes a reinforcement member RM. The reinforcement member RM is located apart from the structure on the detection area AA side and is not in contact with the configuration on the detection area AA side. The reinforcement member RM is formed in, for example, the process of forming the configuration of the detection area AA side and is a multilayered film in which a first layer 101a formed of the same material as that of the insulating film 91a, a second layer 101b formed of the same material as that of the insulating film 91b, a third layer 102 formed of the same material as that of the organic insulating film 92, a fourth layer formed of the same material as that of the interlayer insulating film 93, a fifth layer 104 formed of the same material as that of the organic insulating film 94, a sixth layer 105 formed of the same material as that of the first inorganic insulating film 95, and a seventh layer 106 formed of the same material as that of the sealing film 96 are stacked one on another. Here, the structure of the case where the reinforcement member RM is formed in the process of forming the configuration on the detection area AA side is described, but the structure is not limited to this. Note that the reinforcement member RM may be formed separately from the configuration on the detection area AA side. In this case, the reinforcement member RM may be of a single layer film or a multilayer film in which two or more layers of inorganic film, organic film, or metal film are used in any combination.

With the reinforcement member RM thus provided, the rigidity of the detection device 1 can be improved, thereby making it possible to suppress the occurrence of the drawbacks described in connection with FIG. 5.

Figure 7:
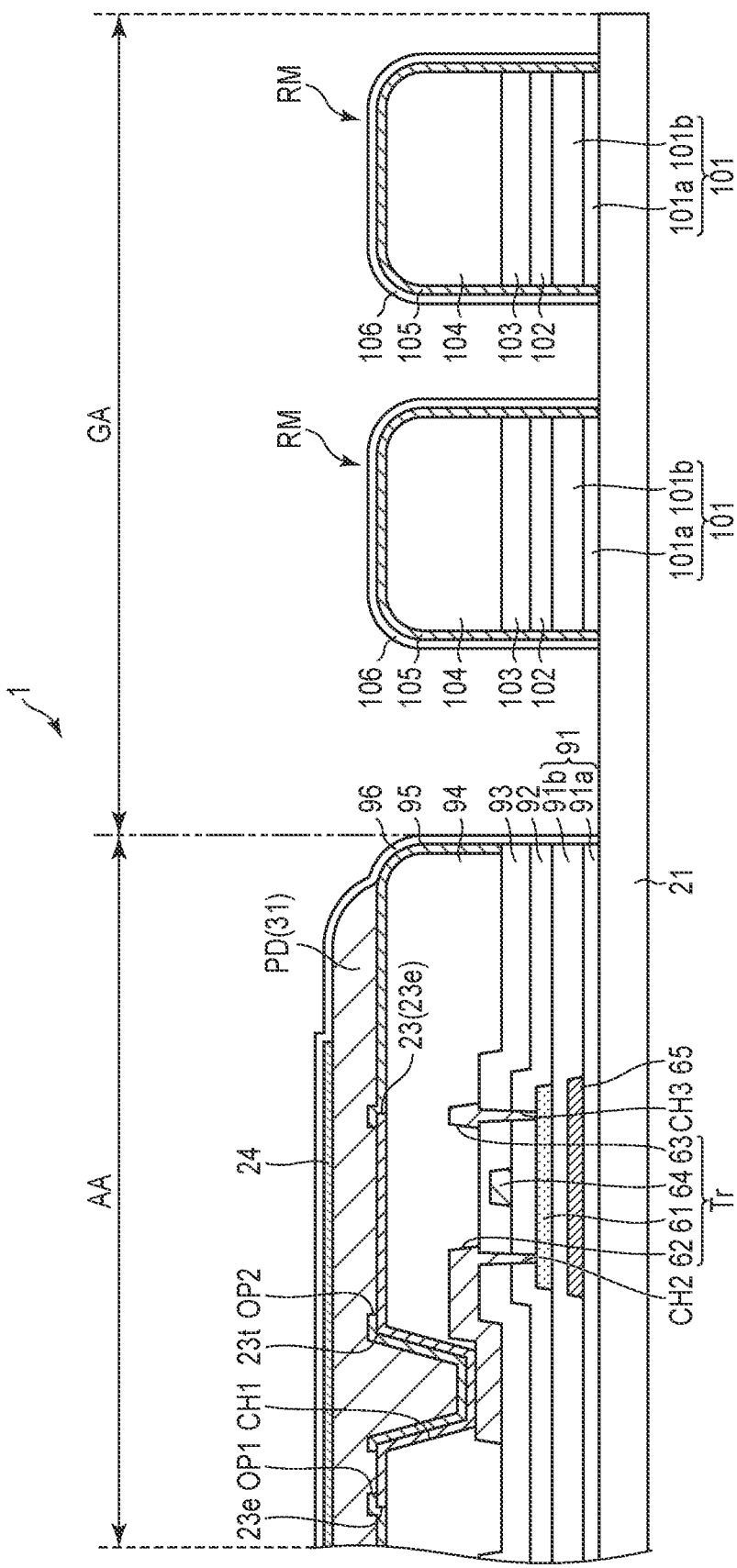
FIG. 7 is another cross-sectional view showing a cross-section of the detection device of the embodiment.

Note that FIG. 6 shows a configuration example in which one reinforcement member RM is provided in the peripheral area GA, but the structure is not limited to this. For example, as shown in FIG. 7, a plurality of reinforcement members RM may be arranged in the peripheral area GA. When multiple reinforcement members RM are arranged in the peripheral area GA, the rigidity of the detection device 1 can be further improved as compared to a configuration in which one reinforcement member RM is provided.

As described above, the detection device 1 comprises a flexible film-like sensor base 21 and a plurality of photodiodes PD arranged on the sensor base 21. The sensor base 21 includes a detection area AA in which the photodiodes PD are arranged and a peripheral area GA on an outer side of the detection area AA, and in the peripheral area GA, a reinforcement member RM extending along the outer circumference of the sensor base 21 is arranged. With this configuration, the rigidity of the detection device 1 is improved and thus it is possible to prevent the sensor base 21 from being excessively bent.

Note that the photodiode PD shown in FIG. 6 is placed only in the detection area AA by applying the materials over the entire surface of the detection device 1, and then wiping up (wiping off) unnecessary portions located outside the detection area AA to be removed, or by removing the unnecessary portions using a laser beam. In such a removal process, if the film thickness of the unwanted portion located outside the detection area AA is excessively great, the unwanted portion is difficult to remove and the removal process takes time, which is problematic.

Figure 8:
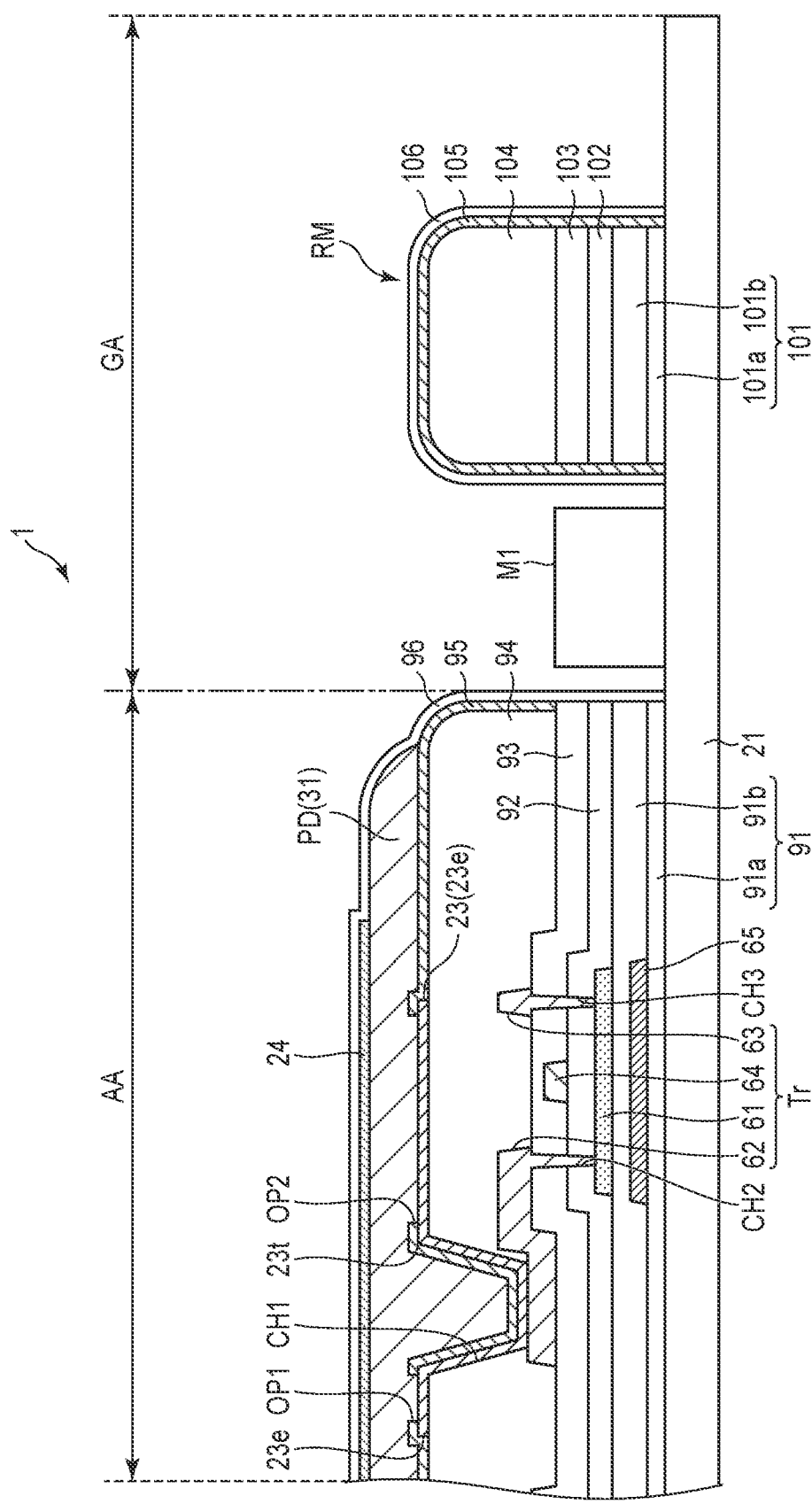
FIG. 8 is still another cross-sectional view showing a cross-section of the detection device of the embodiment.

To solve this problem, the detection device 1 may be further provided with an insulating member M1 between the configuration on the detection area AA side and the reinforcement member RM, as shown in FIG. 8. The insulating member M1 is provided, for example, so as to extend along the reinforcement member RM. The insulating member M1 may be of a single-layer film or a multilayer film containing two or more layers of any combination of inorganic and organic films. The thickness of the insulating member M1 should desirably be set to less than or equal to that of the adjacent configuration (that is, the configuration on the detection area AA side and the reinforcement member RM), which is, for example 2 μm to 3 μm. With this configuration, when the material of the photodiode PD is applied over the entire surface of the detection device 1, the film thickness of the unnecessary portions located outside the detection area AA can be reduced compared to the case where the insulating member M1 is not provided, and the removal of the unnecessary portion can be carried out efficiently. Further, with the insulating member M1 thus provided, the reinforcement member RM and the insulating member M1 are provided in the peripheral area GA, and therefore the rigidity of the detection device 1 can be improved compared to the case where the insulating member M1 is not disposed.

Figure 9:
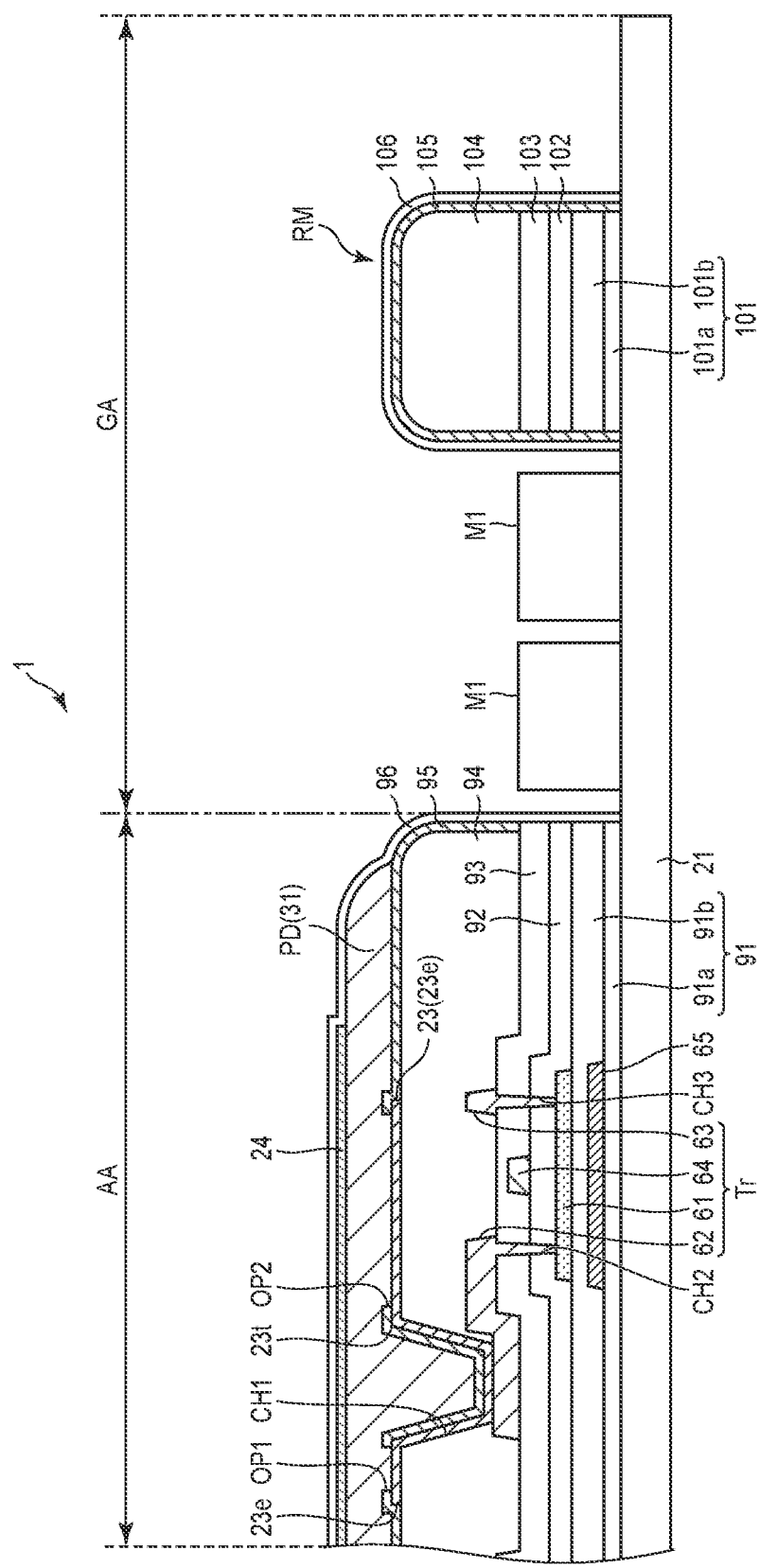
FIG. 9 is still another cross-sectional view showing a cross-section of the detection device of the embodiment.

Note that FIG. 8 shows a configuration example in which the insulating member M1 is arranged so as not to be in contact with either one of the configuration on the detection area AA side and the reinforcement member RM. But, the configuration is not limited to this, and it suffices if the insulating member M1 is arranged so as not to be in contact with at least the configuration on the detection area AA side. Further, FIG. 8 shows a configuration example in which one insulating member M1 is provided between the configuration on the detection area AA side and the reinforcement member RM. But, the configuration is not limited to this, and a plurality of insulating members M1 may be arranged between the configuration on the detection area AA side and the reinforcement member RM, as shown in FIG. 9, for example. When multiple insulating members M1 are provided, the rigidity of the detection device 1 can be improved further as compared to the configuration in which one insulating member M1 is provided.

As described above, according to one embodiment, it is possible to provide a detection device 1 (electronic device) which can suppress damage to the sensor due to stress caused when it is excessively bent.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a flexible film-like insulating base;
a first multilayer film of a plurality of insulating films disposed on the insulating base; and
a sensor disposed on the first multilayer film of the plurality of insulating films, wherein
the insulating base includes a detection area in which the sensor is disposed and a peripheral area on an outer side of the detection area,
the peripheral area includes a first reinforcement member provided thereon to extend along an outer circumference of the insulating base, and
the first reinforcement member includes a second multilayer film of a plurality of insulating films formed of a same material as that of the first multilayer film of the plurality of insulating films disposed under the sensor,
a material constituting the first reinforce member and a material constituting the sensor are not provided between the first reinforce member and the detection area, and
the first reinforce member and the detection area are spaced apart from each other.

2. The electronic device of claim 1, wherein
the insulating base is rectangular, and
the first reinforcement member is disposed to extend along at least two long sides of the insulating base.

3. The electronic device of claim 2, wherein
the first reinforcement member is disposed to extend along two long sides of the insulating base and one of two short sides of the insulating base.

4. The electronic device of claim 1, further comprising:
a first insulating member disposed between the detection area and the first reinforcement member and extending along the first reinforcement member,
the material constituting the first reinforce member and the material constituting the sensor are not provided between the first reinforce member and the first insulating member,
the material constituting the first reinforcement member and the material constituting the sensor are not provided between the first insulating member and the detection area,
the first reinforce member and the first insulating member area are spaced apart from each other, and
the first insulating member and the detection area are spaced apart from each other.

5. The electronic device of claim 4, wherein
the first insulating member has a thickness less than or equal to that of the first reinforcement member.

6. The electronic device of claim 4, wherein
the first insulating member is disposed in a gap between a configuration on the detection area side and the first reinforcement member.

7. The electric device of claim 4, wherein
the first insulating member has a single-layer structure.

8. The electric device of claim 4, wherein
a second insulating member having the same layer structure as that of the first insulating member is further provided between the detection area and the first reinforcement member,
the material constituting the sensor and the material constituting the first reinforcement member are not provided between the first insulating member and the second insulating member,
the first insulating member and the second insulating member are spaced apart from each other, and
the second insulating member and the detection area are spaced apart from each other.

9. The electronic device of claim 1, wherein
the sensor includes a photodiode which outputs an electrical signal according to irradiated light.

10. The electronic device of claim 1, wherein
each of the plurality of insulating films forming the second multilayer included in the first reinforcement member is formed on a same layer as that of the each of the plurality of insulating films forming the first multilayer film disposed under the sensor.

11. The electronic device of claim 1, wherein
the first multilayer film disposed under the sensor include an organic insulating film, and
the second multilayer film included in the first reinforcement member include an insulating film formed of a same material as that of the organic insulating film or an insulating film formed on a same layer as that of the organic insulating film.

12. The electronic device of claim 1, wherein
the second multilayer film included in the first reinforcement member include a first insulating film, a second insulating film, a third insulating film, a fourth insulating film, a fifth insulating film, a sixth insulating film and a seventh insulating film, and
each of the first to seventh insulating films is formed of a same material as that of each of the plurality of insulating films forming the first multilayer film disposed under the sensor or is formed on a same layer as that of each of plurality of insulating films forming the first multilayer film disposed under the sensor.

13. The electric device of claim 1, wherein
a second reinforcement member having the same layer structure as that of the first reinforce member is further provided in the peripheral area,
materials constituting the first reinforce member and the second reinforce member and the material constituting the sensor are not provided between the first reinforce member and the second reinforcement member,
the first reinforce member and the second reinforce member are spaced apart from each other, and
the second reinforce member and the detection area are spaced apart from each other.

14. The electric device of claim 1, wherein
the first reinforcement member further includes an extra film that covers the second multilayer film and is directly in contact with a top surface of one of the plurality of insulating films forming the second multilayer film and side surfaces of at least two of the plurality of insulating films forming the second multilayer film.

* * * * *